(12) United States Patent
Toosi et al.

(10) Patent No.: US 9,059,773 B2
(45) Date of Patent: Jun. 16, 2015

(54) RADIO FREQUENCY TUNER

(75) Inventors: Vahid Mesgarpour Toosi, Mountain View, CA (US); Mohammad Bagher Vahidfar, San Jose, CA (US); Saeid Mehrmanesh, San Jose, CA (US)

(73) Assignee: SITUNE CORPORATION, San Jose, CA (US)

( * ) Notice: Subject to any disclaimer, the term of this patent is extended or adjusted under 35 U.S.C. 154(b) by 761 days.

(21) Appl. No.: 12/711,218

(22) Filed: Feb. 23, 2010

(65) Prior Publication Data

US 2011/0086603 A1    Apr. 14, 2011

Related U.S. Application Data

(60) Provisional application No. 61/250,543, filed on Oct. 11, 2009.

(51) Int. Cl.
*H04B 1/06* (2006.01)
*H04B 1/16* (2006.01)
*H04B 1/10* (2006.01)

(52) U.S. Cl.
CPC ............ *H04B 1/1638* (2013.01); *H04B 1/1027* (2013.01)

(58) Field of Classification Search
CPC . H04W 52/08; H04B 10/6931; H03G 3/3068; H03G 1/0088
USPC .................................... 455/192.1, 232.1, 522
See application file for complete search history.

(56) References Cited

U.S. PATENT DOCUMENTS

| | | | |
|---|---|---|---|
| 6,735,423 B1* | 5/2004 | Uskali et al. ............... | 455/249.1 |
| 7,151,740 B2* | 12/2006 | Zhang et al. ................. | 370/208 |
| 7,394,994 B2* | 7/2008 | Zitzmann et al. ............ | 398/202 |
| 7,532,086 B2* | 5/2009 | Ju et al. ........................ | 333/81 A |
| 7,564,935 B2* | 7/2009 | Suzuki .......................... | 375/354 |
| 7,769,406 B2* | 8/2010 | Lin et al. ...................... | 455/522 |
| 7,853,227 B2* | 12/2010 | Stevenson et al. .......... | 455/232.1 |
| 8,073,646 B2* | 12/2011 | Sato .............................. | 702/106 |
| 2003/0035556 A1* | 2/2003 | Curtis et al. .................. | 381/105 |
| 2003/0129946 A1* | 7/2003 | Giry-Cassan et al. ....... | 455/67.1 |
| 2004/0185814 A1* | 9/2004 | Inamori et al. ............. | 455/232.1 |
| 2005/0281564 A1* | 12/2005 | Zitzmann et al. ............ | 398/202 |
| 2006/0017426 A1* | 1/2006 | Yang et al. ................... | 323/283 |
| 2006/0031689 A1* | 2/2006 | Yang et al. ................... | 713/300 |
| 2007/0047679 A1* | 3/2007 | Suzuki .......................... | 375/345 |
| 2007/0103137 A1* | 5/2007 | Yang ............................ | 323/284 |
| 2007/0105517 A1* | 5/2007 | Chang et al. ............... | 455/249.1 |
| 2007/0165746 A1* | 7/2007 | Maeda .......................... | 375/297 |
| 2007/0184811 A1* | 8/2007 | Ballantyne ................. | 455/343.2 |
| 2007/0232252 A1* | 10/2007 | Inamori et al. ............. | 455/232.1 |
| 2008/0224801 A1* | 9/2008 | Ju et al. ........................ | 333/81 A |

* cited by examiner

*Primary Examiner* — Wesley Kim
*Assistant Examiner* — Richard Chan
(74) *Attorney, Agent, or Firm* — Novak Druce Connolly Bove + Quigg LLP

(57) ABSTRACT

A RF tuner is described for handling RF signals in a broad frequency range and a broad power range while maintaining high linearity and tolerating high power blockers. A continuous feedback loop comprising a substantially linear LNA and a radio frequency RSSI can adjust the power of the RF signal on the RF side. On the IF side, a continuous feedback loop comprising a substantially linear, variable gain transconductor and a RSSI can adjust the power of the IF signal.

16 Claims, 12 Drawing Sheets

RADIO FREQUENCY TUNER

CLAIM OF PRIORITY

This patent application claims priority to U.S. Provisional Patent Application No. 61/250,543 entitled "ARCHITECTURE AND CONFIGURATION FOR THE RF TV TUNER", by Vahid Mesgarpour Toosi, et al., filed on Oct. 11, 2009.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of radio frequency receivers, and more specifically to amplification of radio frequency signals in tuners.

BACKGROUND

In the age of information technology, the requirements of communications systems are increasing at a staggering pace. The receiver is a key component in the performance of communication systems. Its function is to receive incoming signals and process the signals so they can be used by other components in the device. Devices such as cell phones, PDAs, mobile televisions, personal navigation devices, personal media players, and a myriad others contain receivers that perform this function. Signals can be conveyed to a receiver via an antenna, through direct wire transmission, and in other ways.

Ideally, a receiver needs to produce a signal of sufficiently high power that contains undistorted desirable components, such as the preferred channel, and none of the undesirable components, such as blockers, adjacent channels, and noise. Generally, signals are optimized for these traits in a portion of the receiver called a tuner. Building a power efficient, inexpensive, and compact tuner that meets industry standards can be extremely challenging for manufacturers.

First, an incoming signal's power may vary significantly and fluctuate rapidly due to, for example, attenuation, variation in distance between the receiver and the transmitter, fading, and the Doppler Effect. Signal power fluctuations may be in the order of several magnitudes. Hence, a tuner must be capable of performing a broad range of amplification while preserving other signal characteristics. Second, the gain of undesired components can be as much as several orders of magnitude larger than the desired signal and can be located near the desirable channel in the frequency range, for instance, in the case of near adjacent channels. Sharp, selective filtering is required to reject such components. In addition, tuners need to perform in a broad frequency range, such as the broadband TV signal range of 50 MHz-1 GHz, while maintaining a high required signal to noise ratio (SNDR), particularly in TV applications. These problems present significant challenges in integration of RF tuners.

To achieve these goals, existing devices employ CAN tuners, which are large and limited in application. Current solid-state tuners are based on external SAW filters, which are expensive, consume a lot of power, and usually are not applied in inexpensive CMOS technology. What is needed is a highly integrated RF tuner that is compact in size, inexpensive to produce, and exhibits low power consumption.

DETAILED DESCRIPTION

Figure 1:
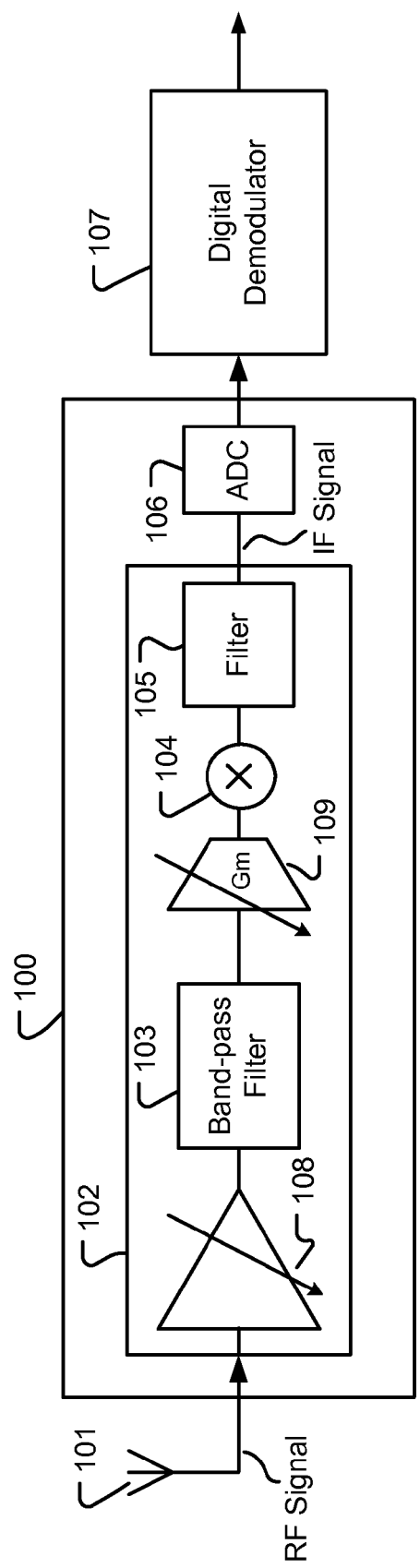
FIG. 1 shows an example of a RF receiver in accordance with various embodiments.

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning communication systems, transmitters, receivers, communication devices, and the like have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, analog components or a combination thereof, unless indicated otherwise. Certain terms are used throughout the following description and Claims to refer to particular system components. As one skilled in the art will appreciate, components may be referred to by different names. This document does not intend to distinguish between components that differ in name, but not function. In the following discussion and in the Claims, the terms "including" and "comprising" are used in an open-ended fashion, and thus should be interpreted to mean "including, but not limited to . . . ."

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Further, in this specification and Claims, it is to be understood that "amplification" can refer to increasing a signal's gain in the case of positive amplification, and to decreasing a signal's gain, or attenuation, in the case of negative amplification. Hence, the term "attenuation" can be interchangeable with the term "amplification" but for the sake of simplicity only one of the terms "amplification" or "attenuation" is used throughout the specification and either term should be understood to encompass both meanings.

In various embodiments, systems and methods are described for handling RF signals in a RF receiver. A RF signal can be received in a portion of the receiver referred to as the RF tuner. The RF tuner can receive a RF signal from an antenna, hard wire, or other means and produce a low frequency signal, such as a baseband or an intermediate frequency (IF) signal. For example, the received RF signal can be a broadband TV signal in UHF and VHF frequencies. The produced signal can be an IF signal or an IF in-phase (I) signal component and an IF quadrature-phase (Q) signal component.

FIG. 1 shows an example of a RF receiver in accordance with various embodiments. A RF signal can be received in an antenna 101 and conveyed to a RF receiver 100. In the RF receiver 100, the signal can be conveyed to a RF tuner 102. In the RF tuner 102, the signal can be amplified in amplifier stages with adjustable level of gain 108. The level of amplification in the amplifier stage 108 can be adjusted based on a measured power of the signal, such as in a continuous feedback loop, to produce a signal of a fixed desired power. After amplification in the amplifier stage 108, the signal can be conveyed to a band-pass filter 103 to filter out undesirable signal components such as blockers. After the band-pass filter 103, the signal can be conveyed to a transconductor with adjustable level of amplification 109 to transform the signal from voltage to current and adjust the signal's gain. The level of amplification in the transconductor 109 can be adjusted based on a measured power of the signal, such as in a continuous feedback loop, to produce a signal of a fixed desired power. After the transconductor 109, the signal can be conveyed to a mixer 104, where the signal can be down converted to a low frequency, such as intermediate frequency. After the mixer 104, the signal can be conveyed to a filter stage 105, to filter out high and/or low undesired frequencies. From the tuner 102, the signal can be conveyed to an analog to digital converter (ADC) 106 to convert the signal to the digital domain. The digital signal can then be conveyed from the RF receiver 100 to a digital demodulator 107, where it can be processed further before being conveyed to other portions of the device.

The RF signal received at the tuner 102 can contain undesired signal components such as blockers, adjacent channels, and/or noise. The gain of undesired blockers can be orders of magnitude larger than the desired signal and can be located near the desirable channel in the frequency range, for instance, in the case of near adjacent channels. Sharp, selective filtering can be utilized to reject such blockers. In addition, tuners may need to perform in a broad frequency range, such as the broadband TV signal range of 50 MHz-1 GHz, while maintaining a high required signal to noise ratio (SNDR), particularly in TV applications. These problems present significant challenges in integration of RF tuners.

Further, an incoming signal's power may vary significantly and fluctuate rapidly due to, for example, attenuation, variation in distance between the receiver and the transmitter, fading, and the Doppler Effect. Signal power fluctuations may be in the order of several magnitudes. Hence, it can be advantageous for a tuner to perform a broad range of amplification while preserving other signal characteristics. As will be seen, the embodiments described herein provide such a tuner platform in an elegant manner.

To achieve these goals, existing devices employ CAN tuners, which are large and limited in application. Further, current solid-state tuners are based on external SAW filters, which are expensive, consume a lot of power, and usually are not applied in cost-effective CMOS technology. According to the invention, systems and methods are provided herein for an architecture that can allow construction of highly integrated, compact, inexpensive, and power efficient tuners that can be employed in CMOS technology.

For example, according to one embodiment, high-power blockers, high SNDR requirements, and a high dynamic range of input signal power poses significant challenges for TV tuners developed in sub-micron CMOS process technology. High-power blockers introduce non-linearity into a signal when the blockers pass through each stage of the tuner. For example, in a received RF signal containing a 0 dBm adjacent channel component and a −20 dBm desired signal component, to meet a 40 dB SNDR requirement, the nonlinearity components introduced by the adjacent channel passing through tuner stages must be kept below −60 dBm (−20d dBm−40 dB=−60 dBm), which can be challenging, especially in sub-micron CMOS process technology. Further, since a signal may need to be attenuated and filtered, all the tuner stages, including attenuation stages and filtering stages, should meet this linearity requirement. Moreover, to meet industry requirements, any solution should be cost effective and compact.

According to one embodiment, the challenges of RF tuners can be addressed by employing multi-stage amplification and filtering with continuous and substantially linear power level control in each stage. Different stages can be employed for attenuating near and/or far blockers while preserving noise performance and achieving desirable signal gain. Multi-stage amplification and filtering can also be desirable in amplifying low power signals and signals close to the sensitivity power level of the tuner. Far blockers can be removed in a band-pass filter (BPF), while near blockers can be attenuated after down conversion. Further, a bypass mode can be considered for high input power signals, such as signals three to four orders of magnitude higher in power than the tuner's sensitivity level. In order to keep a required SNDR, signal and blocker power can be estimated in each stage and the gain on the respective RF path can be adjusted continuously; for example, through feedback loops.

In various embodiments, the power of the signal at the input to the band-pass filter 103 can be fixed at a preferred value by controlling the amplification of the RF signal in the amplification stage 108. For example, a feedback loop can be utilized that measures signal power at the input of the band-pass filter 103 and adjusts amplification in the amplifier stage 108 accordingly. Far blockers can be removed in the band-pass filter 103.

Further, the power of the received RF signals at the RF tuner 102 can vary by as much as several magnitudes, hence, a system that amplifies incoming signals to produce signals of a fixed power can be configured for amplifying signals in a wide range of incoming powers. With this in mind, in various embodiments, a received RF signal can be amplified in a set of components with a large range of adjustable amplification, the power of the signal after amplification can be measured, and the level of amplification in the set of components can be adjusted to fix the power of the signal at a preferred power value. As will be described below, the level of amplification in the set of components can be adjusted continuously using systems such as continuous feedback loops and/or multiple, selectable amplification paths.

In various embodiments, an amplifier stage, such as the amplifier stage 108 of FIG. 1, can comprise low noise amplifiers (LNAs) and/or buffers with adjustable levels of amplification and/or attenuation. The amount of amplification of the RF signal in the LNAs and/or buffers can be controlled through continuous feedback loops. A continuous feedback loop can comprise a unit that measures signal power, which measurement can be continuous, and a unit that adjusts the amplification and/or attenuation in the LNAs and/or buffers based on the measured signal power according to defined executable logic contained in the device, which adjustment can be continuous.

Further, the amplification in the amplifier stage can be adjusted by conveying the RF signal down one of a multiple amplification paths, wherein each amplification path can produce a different amount of amplification and/or attenuation of the RF signal. Any of the multiple amplification paths can contain LNAs and/or buffers, which LNAs and buffers can be adjustable in a feedback loop. The multiple amplification paths can contain continuous feedback loops to adjust amplification and/or attenuation of the RF signal in LNAs and/or buffers on the path.

Figure 2:
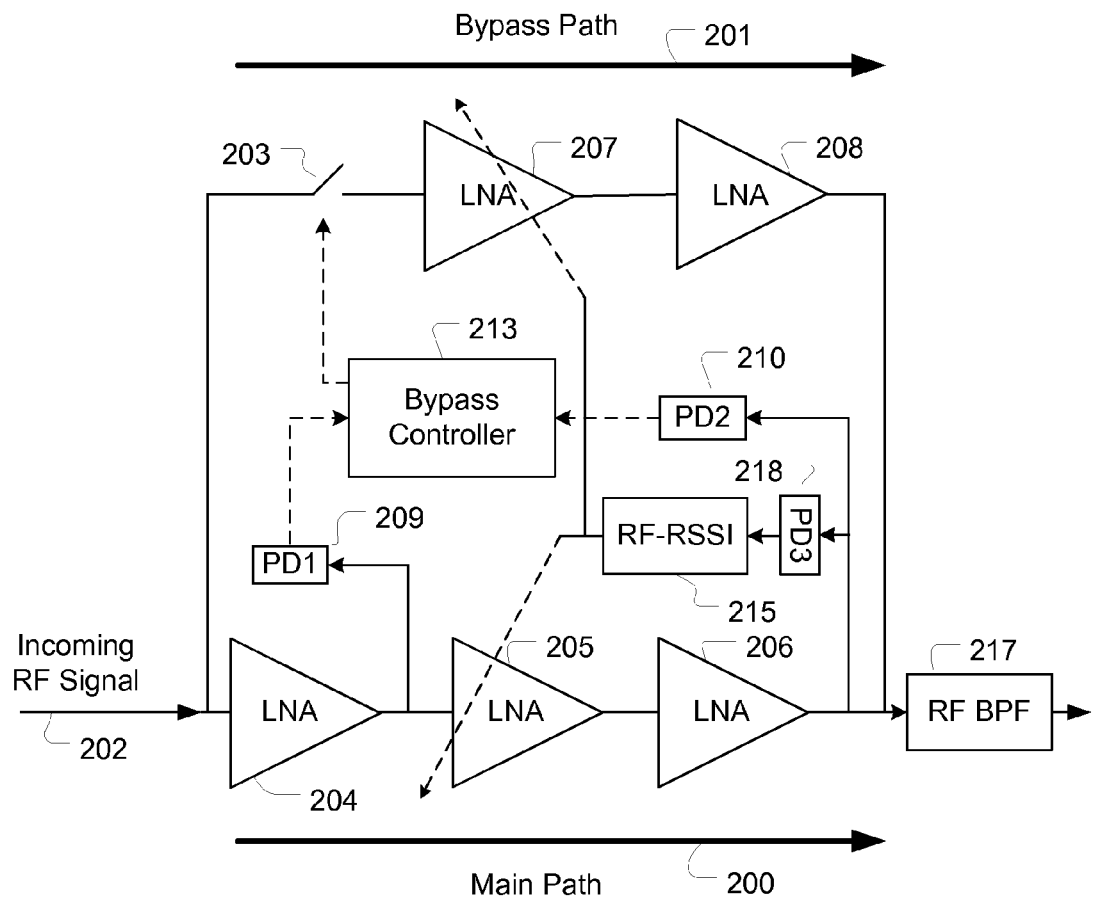
FIG. 2 shows an example of an amplifier stage in a RF tuner, in accordance with various embodiments of the invention.

FIG. 2 shows an example of an amplifier stage in a RF tuner, in accordance with various embodiments of the invention. The amplifier stage 108 in FIG. 1 can include components as described in the example of FIG. 2. In the example illustrated, an incoming RF signal 202 can be conveyed down a main path 200 or a bypass path 201. The incoming RF signal 202 conveyed to a first LNA 204 on the main path 200 or a first LNA 207 on the bypass path 201 can be single ended or differential. After the first LNAs 204, 207, the signal can be differential.

Initially, the signal can be conveyed down the main path 200, which can be configured to optimize amplification of low power signals, such as signals of power lower than −30 dBm, for signal characteristics such as noise figure and linearity. A first power detector (PD1) 209 can measure the power of the signal after it is amplified in the first LNA 204 to produce a first power value, P1. An example of such a power detector will be described in further detail in FIG. 6. The power value P1 can be conveyed to a bypass controller 213 where a decision can be made, based on the value P1, to convey further incoming RF signals 202 down the bypass path 201, which bypass path 201 can produce less amplification of the RF signal than the main path 200. The bypass path 201 can be configured to optimize amplification of high power signals, such as signals of power higher than −20 dBm, for signal characteristics such as noise figure and linearity. In this case, the bypass controller 213 can send a signal to close the switch 203 and thereby convey subsequent incoming RF signals 202 down the bypass path. For example, the bypass controller 213 may compare P1 to a first threshold value, T1. In an embodiment, if P1 is higher than T1, then the bypass controller 213 can switch amplification to the bypass path 201. In various embodiments, to stabilize the system, the logic incorporated into the bypass controller 213 can delay switching amplification paths and/or use averages of P1 instead of single measurements. For instance, in various embodiments, the bypass controller 213 can switch amplification to the bypass path if the average value of P1 over a predefined time period or for a predefined number of measurements is higher than T1. In other embodiments, switching may be delayed until a predefined number of measurements, out of a total number of measurements of P1, are higher than T1.

In the figure, the bypass switch 203 is intended to illustrate the function that incoming RF signals 202 will be conveyed down the bypass path and not the main path 200 when the switch 203 is in the closed position. It will be apparent, to one skilled in the art, that other and additional means may be used to activate the preferred path and deactivate the un-preferred path, such as having switches on both paths and/or powering up and powering down components on the preferred and un-preferred paths.

With the incoming RF signal 202 routed to the bypass path, amplification can be performed in the first 207 and second 208 LNAs. In various embodiments, the first LNA 207 can be an adjustable LNA producing gain that can be varied from 0 to −30 dB, and the second LNA 208 can produce 10 dB gain. After amplification, the signal power can be measured in a second power detector (PD2) 210 to derive a second power value P2. An example of such a power detector will be described in further detail in FIG. 6. The power value can be conveyed to the digital bypass controller 213 where a decision can be made, based on the value P2, to convey further incoming RF signals 202 down the main path 200. In which case, the bypass controller 213 can send a signal to open the switch 203 and thereby convey subsequent incoming RF signals 202 down the main path. For example, the bypass controller 213 can compare P2 to a second threshold value, T2. In an embodiment, if P2 is lower than T2, then the bypass controller 213 can switch amplification to the main path 200. In various embodiments, to stabilize the system, the logic incorporated into the bypass controller 213 can delay switching amplification paths and/or use averages of P2 instead of single measurements. For instance, in various embodiments, the bypass controller 213 can switch amplification to the main path if the average value of P2 over a predefined time period or for a predefined number of measurements is lower than T2. In other embodiments, switching can be delayed until a predefined number of measurements, out of a total number of measurements of P2, are lower than T2.

The threshold values T1 and T2 can be set to introduce more stability into the system. For example, T1 and T2 can be set to create an incoming signal power hysteresis in the system. Namely, the values T1 and T2 can be chosen so that amplification is switched to the bypass path for incoming signals of higher power than the incoming signals for which amplification is switched back to the main path. An advantage of this embodiment is that incoming signals that produce power measurements that fluctuate around one of the threshold values will not cause the system to rampantly switch between routines thereby creating instability. For example, in various embodiments, the value of T1 can be in the range of −15 dBm to −5 dBm, for instance, −10 dBm. In various embodiments, T2 can be in the range of −35 dBm to −25 dBm, for example, −30 dBm.

In various embodiments, with amplification of the RF signal being performed on the main path 200, the amount of amplification in the LNAs on the main path 200 can be adjusted using a continuous feedback loop. For example, in various embodiments, after amplification in the first 204, a second 205, and a third 206 LNA, the signal can be conveyed to a third power detector (PD3) 218 and then to an RF RSSI 215. The signal power can be measured in the power detector 218 and the power value signal can be conveyed to the RF RSSI 215. An example of such a power detector will be described in further detail in FIG. 6. The power of the signal produced on the main path 200 can be controlled by adjusting the amount of amplification in the second LNA 205 based on the measured signal power according to executable logic incorporated in the RF RSSI 215, the adjustment of amplification can be performed continuously. In an embodiment, the signal power can be measured using continuous wideband RF power measurement. The power detector 218 can be located in the RF RSSI 215 or the power detector 218 can be a separate component from the RF RSSI 215. Hence, in various embodiments, the RF RSSI 215 can be configured so that the power of the signal produced on the main path 200 is a determined, fixed preferred value. For example, the continuous feedback loop can be configured so that the determined preferred value of the signal power after amplification on the main path 200 is −20 dBm. In that case, if the RF RSSI 215 measures that the power of the produced signal is −15 dBm, the RSSI can send a signal to the adjustable LNA 205 to decrease amplification in the adjustable LNA 205 by 5 dB. Similarly, if the RF RSSI 215 measures that the produced signal's power is −25 dBm, the RF RSSI 215 can send a signal to the adjustable LNA 205 to increase amplification in the adjustable LNA 205 by 5 dB. In various embodiments, the RF RSSI 215 can be configured so that the determined preferred power value of the signal produced on the main path 200 in the continuous feedback loop can be changed. For example, either through user input or through a decision made by logic incorporated in the device, the determined preferred power value of the signal after amplification on the main path 200 in the device of the above example may be changed to −18 dBm instead of −20 dBm. In various embodiments, the determined preferred power value of the signal can be programmable through serial ports in the RF RSSI 215 through a SPI or an I2C protocol.

In various embodiments, with amplification of the RF signal being performed on the bypass path 201, the amount of amplification in the LNAs on the bypass path 201 can be adjusted using a continuous feedback loop. For example, in various embodiments, after amplification in the first 207 and second 208 LNAs, the signal can be conveyed to a third power detector (PD3) 218 and then to a RF RSSI 215. The signal power can be measured in the power detector 218 and the power value signal can be conveyed to the RF RSSI 215. An example of such a power detector will be described in further detail in FIG. 6. The power of the signal produced on the main path 200 can be controlled by adjusting the amount of amplification in the second LNA 205 based on the measured signal power according to executable logic incorporated in the RF RSSI 215, the adjustment of amplification can be performed continuously. In an embodiment, the signal power can be measured using continuous wideband RF power measurement. The power detector 218 can be located in the RF RSSI 215 or the power detector 218 can be a separate component from the RF RSSI 215. Hence, in various embodiments, the RF RSSI 215 can be configured so that the power of the signal produced on the bypass path 201 is a determined preferred value. For example, the continuous feedback loop can be configured so that the determined preferred value of the signal power after amplification on the bypass path 201 is −20 dBm. In that case, if the RF RSSI 215 measures that the produced signal's power is −15 dBm, the RSSI can send a signal to the adjustable LNA 207 to decrease amplification in the adjustable LNA 207 by 5 dB. Similarly, if the RF RSSI 215 measures that the produced signal's power is −25 dBm, the RSSI can send a signal to the adjustable LNA 207 to increase amplification in the adjustable LNA 207 by 5 dB. In various embodiments, the RF RSSI 215 can be configured so that the determined preferred power value of the signal produced on the bypass path 201 in the continuous feedback loop can be changed. For example, either through user input or through a decision made by logic incorporated in the device, the determined preferred power value of the signal after amplification on the bypass path 201 in the device of the above example may be changed to −18 dBm instead of −20 dBm. In various embodiments, the determined preferred power value of the signal can be programmable through serial ports in the RF RSSI 215 through a SPI or an I2C protocol.

In an embodiment, the first stage LNA 204 on the main path 200 can be in broadband, covering UHF and VHF bands. The input impedance of the LNA 204 can be matched to the input, for example, the LNA 204 can be matched to an antenna at 50 Ohms or 75 Ohms at the input. Moreover, this stage can act as a single to differential converter to protect the signal from the common mode noise of the chip power supplies and ground (GND). Since the total noise figure (NF) of the tuner is highly dependent on the NF and gain of the first stage LNA 204, this stage can be designed to have a minimal NF, such as 2.5 dB. In order to reduce the noise introduced in subsequent stages, moderate gain, such as 18 dB, can be introduced in the first stage LNA 204.

In various embodiments, the second stage LNA 205 on the main path 200 and/or the first stage LNA 207 on the bypass path 201 can be a buffer with adjustable attenuation of 1 dB to 30 dB. The LNAs 205, 207 can be designed to be substantially linear to handle high power signals. As will be illustrated in FIG. 3 and FIG. 4, to achieve high linearity and programmable gain, a differential attenuator made by several, for example 12, parallel paths can be utilized in the LNAs 205, 207.

Figure 3:
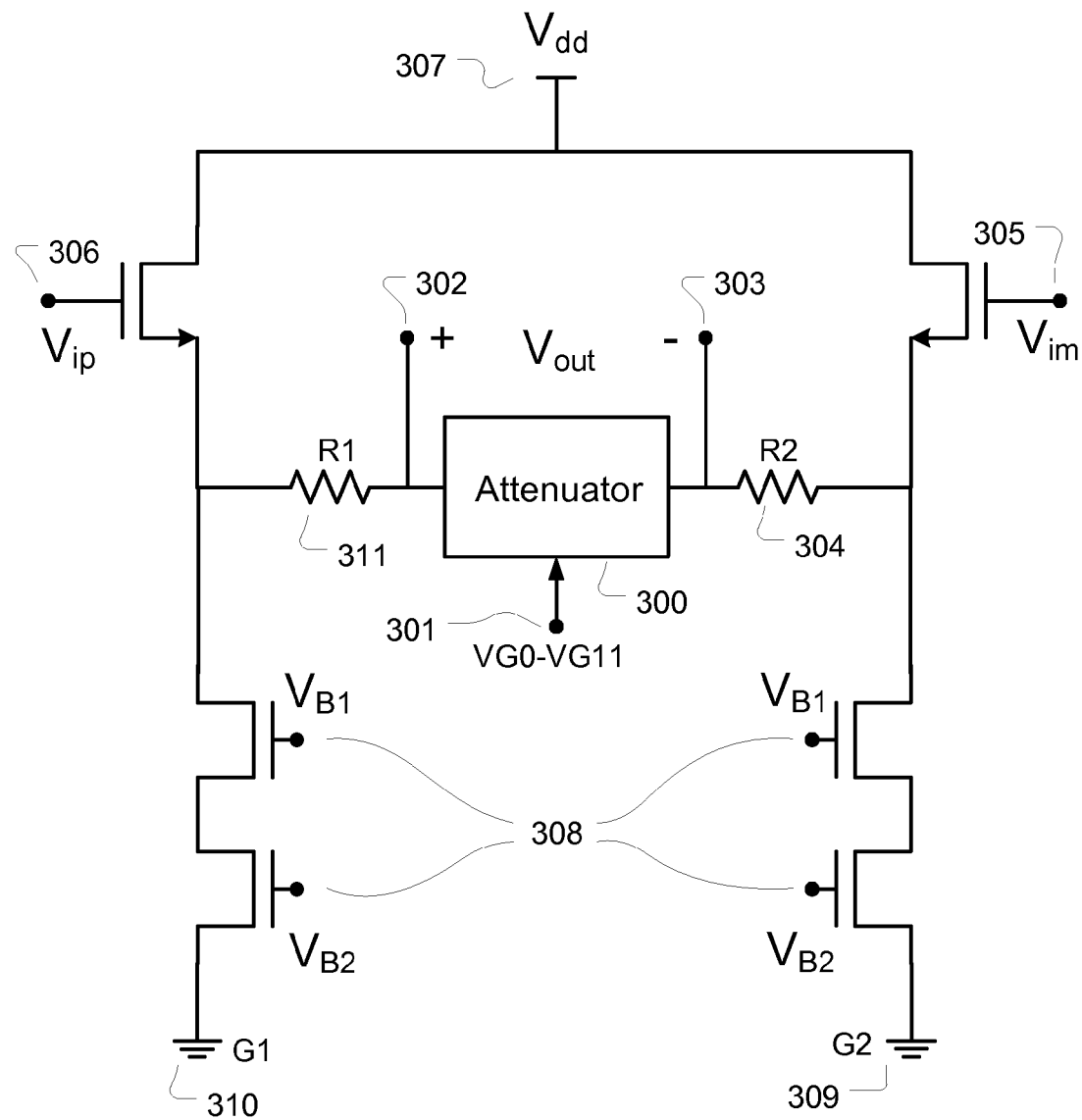
FIG. 3 shows an example of a buffer comprising an adjustable, substantially linear attenuator, in accordance with one embodiment.

FIG. 3 shows an example of a buffer comprising an adjustable, substantially linear attenuator, in accordance with one embodiment. The second LNA 205 on the main path 200 and/or the first LNA 207 on the bypass path 201 in FIG. 2 can contain such a buffer. The buffer may include a substantially linear, programmable attenuator 300. In the example illustrated, $V_{dd}$ 307 may be a power supply, $V_{ip}$ 306 may be a positive input, $V_{im}$ 305 may be a negative input, R1 311 may be a resistor, R2 304 may be a resistor, G1 310 and G2 309 may be grounds connections, VG0-VG11 301 may be control voltage signals that control the amount of attenuation in the attenuator 300, the terminals $V_{B1}$ and $V_{B2}$ 308, may be bias voltages, and $V_{out}$ "+" 302 and $V_{out}$ "−" 303 may be differential outputs. The components may be electronically connected as illustrated. In the example, the amount of attenuation in the buffer is adjusted by controlling the amount of attenuation in the attenuator 300 through 12 control voltage signals VG0-VG11 301, which control voltage signals 301 can be conveyed from other portions of the device such as, for example, an RSSI such as the RF-RSSI 215 in FIG. 2. In various embodiments, the buffer can contain a single attenuator or several attenuators in series. Placing several attenuators in series can improve characteristics such as linearity and symmetry performance. An example of the attenuator 300 will be described in further detail in FIG. 4, and an example of an RF RSSI 215 will be described in further detail in FIGS. 7 and 8.

Because the signals conveyed to a buffer can be high power and the buffer may need to be adjustable for a broad range of attenuation, building a suitable attenuator in the buffer can be challenging. Namely, because adjustable components, such as active resistors, have good linearity performance over only a limited range of resistance, building an attenuator that performs well over a broad range of signals is challenging. To overcome this difficulty, in one embodiment, an attenuator can contain several parallel paths. The received signal can be conveyed to a subset of the parallel paths within the attenuator. For example, a switch on each path can either open or close that path. Hence, by closing or opening corresponding switches, a determined subset of paths for a desired amount of attenuation can be selected. Further, each path can be capable of producing different amounts of attenuation. For example, each path can contain a different resistor and produce a different amount of resistance. Further, the resistance on each path can be variable, for example by implementing a variable resistor. In one embodiment, each parallel path can contain an active resistor, such as an active resistor made by MOS transistors that act as MOS switches. A switch can be closed to select a corresponding path and opened to de-select it. Further, the switch can be modulated, that is, it can be maintained between the closed and opened position to vary the amount of resistance produced on the path.

Figure 4:
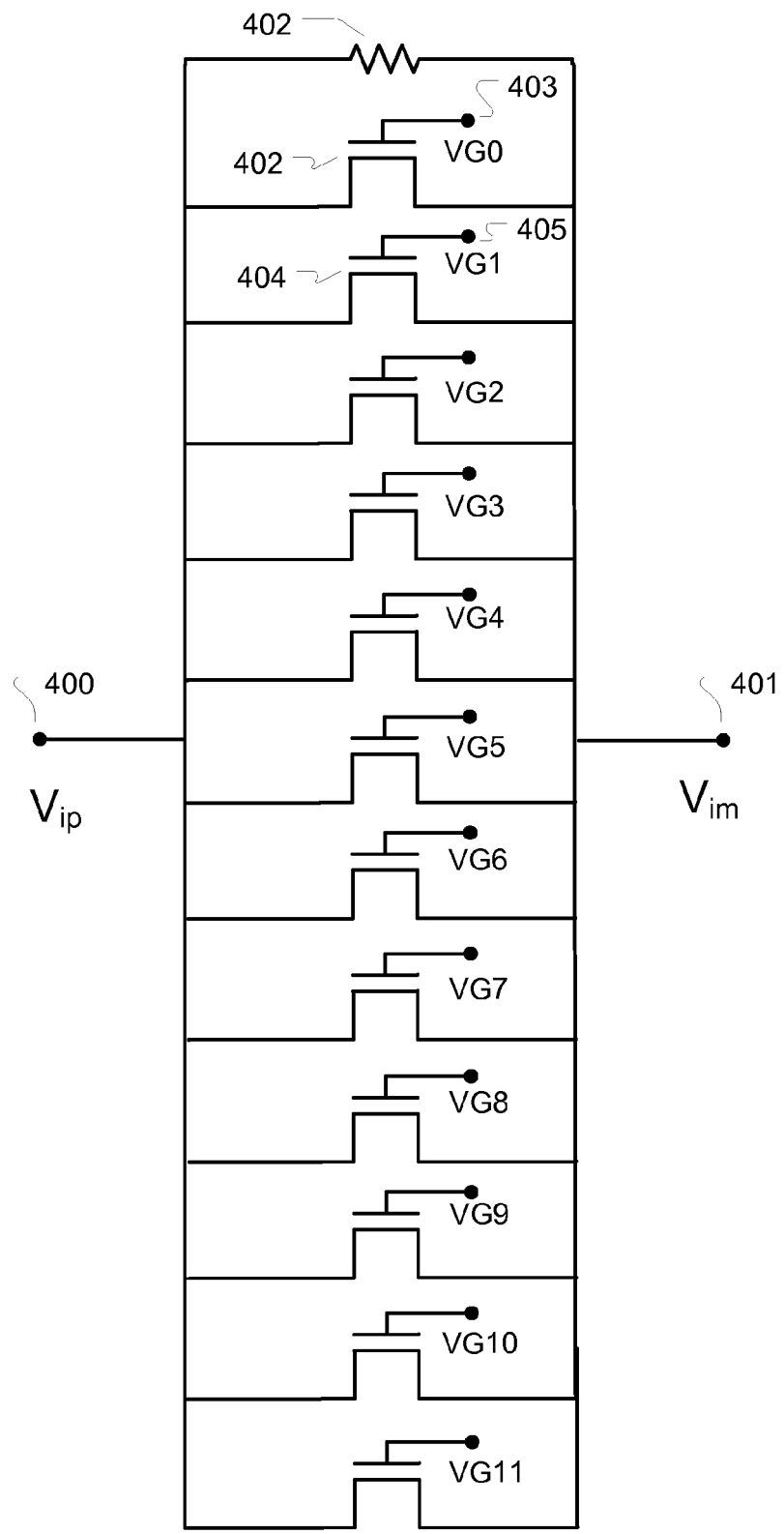
FIG. 4 shows an example of an attenuator that can be contained in a buffer, in accordance with various embodiments.

FIG. 4 shows an example of an attenuator that can be contained in a buffer, in accordance with various embodiments. The second LNA 205 on the main path 200 and/or the first LNA 207 on the bypass path 201 in FIG. 2 can comprise a buffer containing such an attenuator. The illustrated attenuator can be an example of the attenuator 300 described in FIG. 3. As FIG. 4 illustrates, a positive input of the attenuator, $V_{ip}$ 400, can be connected to a negative input of the attenuator, $V_{im}$ 401, by several, for example thirteen, parallel paths. The positive input $V_{ip}$ 400 and the negative input $V_{im}$ 401 can be connections from the buffer, such as the connections to the attenuator 300 in FIG. 3. From the top of the figure, the first path of the attenuator can contain a passive resistor 402. The second path can contain an active resistor 402, such as an active resistor made by MOS transistors that act as MOS switches, which active resistor 402 can be controlled by a first control signal, VG0, 403. The next path can contain another active resistor 404 that can be controlled by a second control signal, VG1, 405. Similarly, the remaining 10 paths can each contain an active resistor that is controlled by a respective control signal. Control signals VG0 403 through VG11 can be the control signals conveyed to the attenuator in the buffer, such as the signals VG0-VG11 301 in FIG. 3. On each parallel path, the respective control signal can operate to open or close an active resistor on the path. By controlling which resistors are opened and closed, the resistance between the inputs 400, 401 can be adjusted. Further, the switches on the paths can be modulated, that is, they can be maintained between the closed and opened position to vary the amount of resistance produced on the path. By modulating switches, continuity in the level of attenuation can be achieved. Accordingly, the level of attenuation in the attenuator can be controlled by the control signals VG0 to VG11.

The size and ordering of the active resistors in the attenuator can be selected to achieve a large range of adjustable attenuation while maintaining linearity. For example, the value of big resistors can increase linearly while the values of small resistors can be binary weighted. Hence, in various embodiments, the respective widths of the transistors in the active resistors on the second to the thirteenth parallel path, respectively, can be: 0.5 W; 1 W; 1.5 W; 2 W; 3 W; 4 W; 6 W; 9 W; 12 W; 18 W; 24 W; 48 W. Further, nonlinear components can be created when an active resistor is between the open and closed position. Hence, to achieve substantial linearity, the system can be configured so that at any given time most of the switches are in the open or closed position and only 1 or 2 switches are between the open and closed position. As will be described below, additional circuitry can be used to generate the control signals VG0 to VG11 that control the active resistors to achieve this. Further, such a circuit can be configured so that the relationship between resistance and control voltage is linear.

The third stage LNA 206 on the main path 200 and the second stage LNA 208 on the bypass path 201 in FIG. 2 can be linear voltage to current converters (transconductors) loaded with a band-pass filter (RF BPF) 217 based on LC resonators. The RF BPF 217 can be primarily responsible for far blocker rejection and can be programmable to cover a broadband frequency range by configuring several switched capacitors and inductors, for example six to eight switched capacitors can be used to tune the RF BPF 217 in the UHF band. Since the impedance of the LC resonator will vary with frequency due to dependency of the resonator's quality factor (Q) on frequency, the input transconductance of this stage can also be programmed to keep the gain flat over a desired range, such as 12-15 dB. In various embodiments, the RF BPF 217 and/or the transconductors 206, 208 can be programmed through SPI (serial parallel interface) or I2C protocol.

Figure 5:
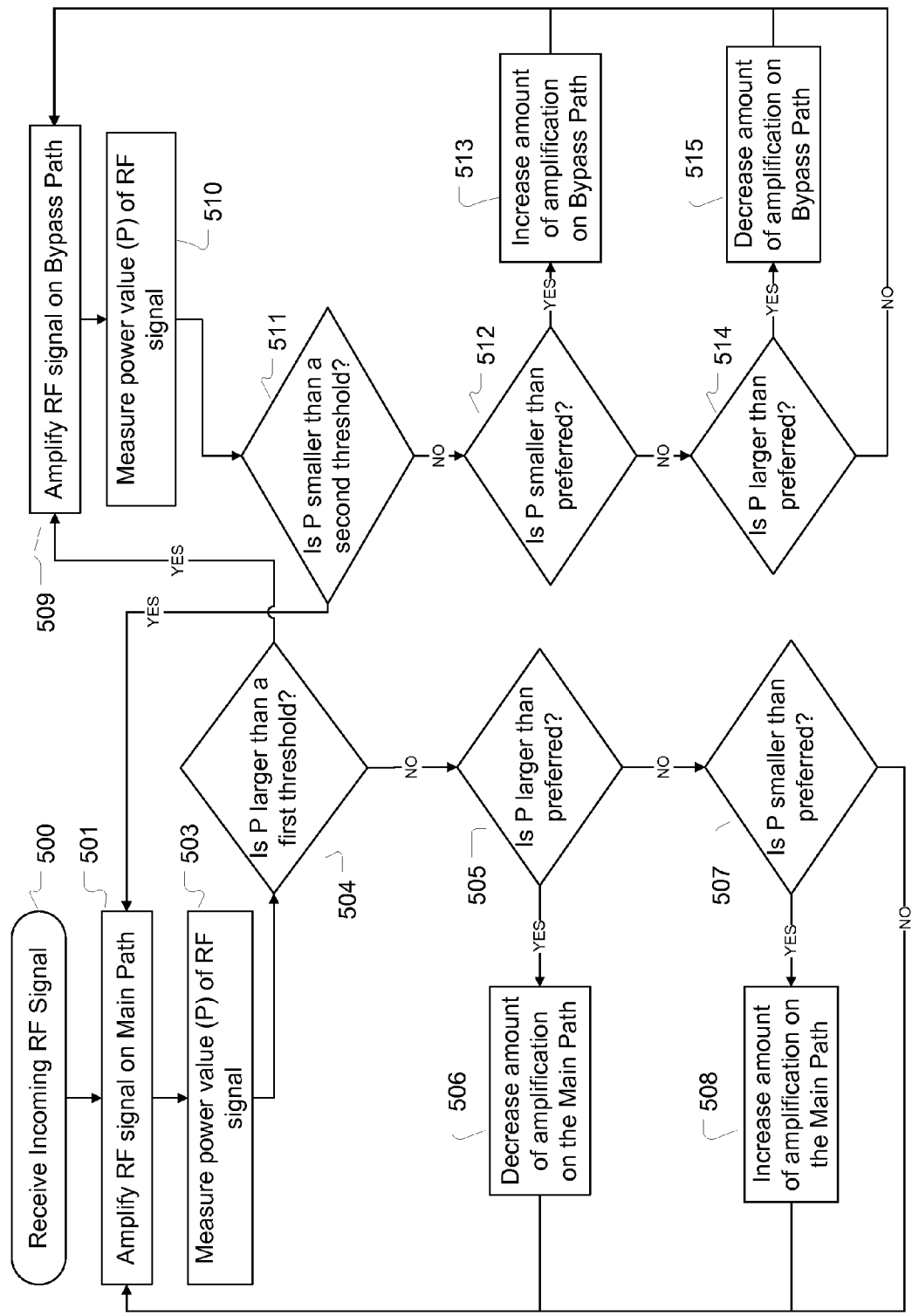
FIG. 5 is a flow-chart illustration of the process of RF signal amplification in a RF tuner, in accordance with various embodiments of the invention.

FIG. 5 is a flow-chart illustration of the process of RF signal amplification in a RF tuner, in accordance with various embodiments of the invention. The example of the process illustrated in the figure can be applied in a configuration of components as illustrated in the example of FIG. 2. As illustrated in FIG. 5, an incoming RF signal can be received at the RF tuner 500. The signal can be amplified on a Main path 501 and the power of the RF signal can be measured 503 after amplification to derive a power value (P). If the measured power value is larger than a first defined threshold, then a decision 504 can be made to perform further amplification of the RF signal on a Bypass Path 509, which Bypass Path is capable of producing less amplification than the Main Path. As described in FIG. 2, in various embodiments, to produce stability, switching between the Main and Bypass paths can be delayed by using averaging, hysteresis, or other types of delaying and/or confirmation mechanisms. Otherwise, if the measured power is larger than a preferred power value, then a decision 505 can be made to decrease the amount of amplification on the Main Path 506 and amplification of subsequent RF signals can take place on the Main Path 501 with decreased levels of amplification. Otherwise, if the measured power is smaller than a preferred power value, then a decision 507 can be made to increase the amount of amplification on the Main Path 508 and amplification of subsequent RF signals can take place on the Main Path 501 with increased levels of amplification. Otherwise, amplification of subsequent RF signals can take place on the Main Path 501 with unchanged levels of amplification. With the signal being amplified on the Bypass path, 509, the power of the RF signal can be measured 510 after amplification to derive a power value (P). If the measured power value is smaller than a second defined threshold, then a decision 511 can be made to perform further amplification of the RF signal on the Main Path 501. Otherwise, if the measured power is smaller than a preferred power value, then a decision 512 can be made to increase the amount of amplification on the Bypass Path 513 and amplification of subsequent RF signals can take place on the Bypass Path 509 with increased levels of amplification. Otherwise, if the measured power is larger than a preferred power value, then a decision can be made 514 to decrease the amount of amplification on the Bypass Path 515 and amplification of subsequent RF signals can take place on the Bypass Path 509 with decreased levels of amplification. Otherwise, amplification of subsequent RF signals can take place on the Bypass Path 509 with unchanged levels of amplification. The process can be performed continuously.

In various embodiments, the RF tuner can contain more than two alternative paths for signal amplification. In that case, the system can contain additional bypass switches and executable logic to route the signal to either amplification path based on the signal power as will be apparent to a person of reasonable skill in the art in view of this disclosure. In another embodiment, the RF tuner can contain only a single amplification path with a continuous feedback loop, as described above, on the path for adjusting amplification of RF signals on the path. In other embodiments, the RF tuner can contain several paths, some or none of which can contain continuous feedback loops, as described above, for adjusting amplification of RF signals on the relative path.

Figure 6:
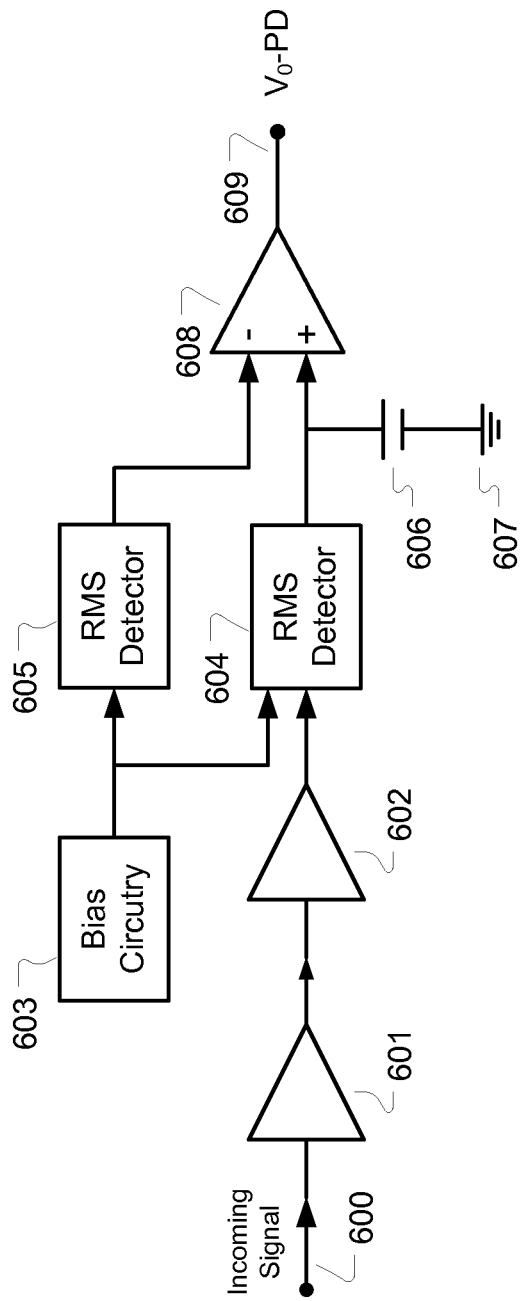
FIG. 6 shows an example of a power detector, in accordance with various embodiments.

FIG. 6 shows an example of a power detector, in accordance with various embodiments. The power detectors PD1 209, PD2 210, and/or PD3 218 in FIG. 2 can include architecture of the illustrated example. In the example illustrated, a power detector can receive an incoming signal 600 and produce a power detection signal $V_O$-PD 609. Bias Circuitry 603 can produce a signal of a fixed voltage and convey that signal to two root-mean-square (RMS) Detectors 604, 605. The incoming signal 600 can be conveyed to a first LNA 601, to a second LNA 602, and to an RMS Detector 604. The signals from the RMS power detectors 604, 605 can be conveyed to an amplifier 608. The signal from the RMS Detector 604 can be conveyed to a capacitor 606 and a ground connection 607. The power detection signal $V_O$-PD 609 can be produced in the amplifier 608. The components may be electronically connected as illustrated. From the power detector, the power detection signal $V_O$-PD 609 can be conveyed to other components, such as a RSSI.

Figure 7:
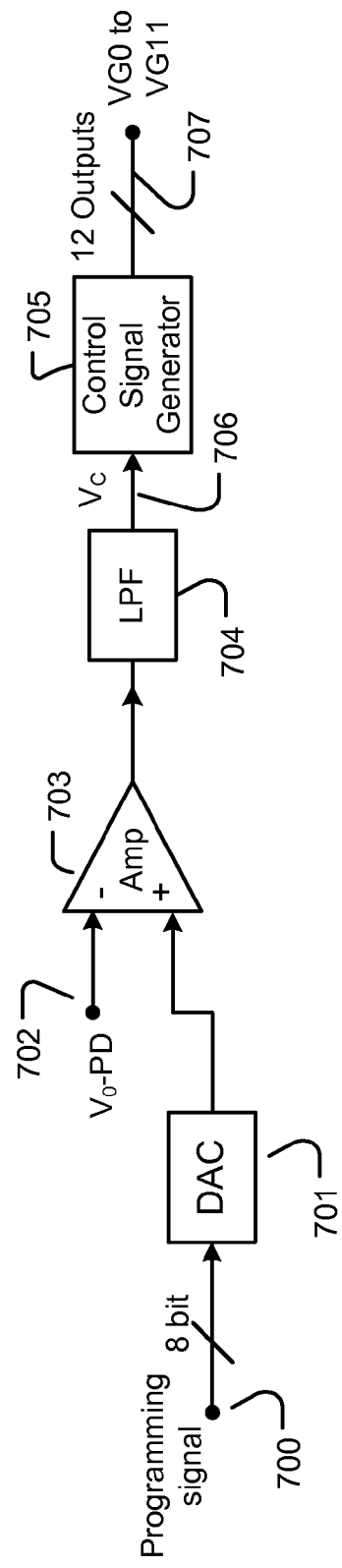
FIG. 7 shows an example of a radio frequency RSSI in accordance with one embodiment.

FIG. 7 shows an example of a radio frequency RSSI in accordance with one embodiment. The RF-RSSI 215 of FIG. 2 can contain architecture of the illustrated example. In the example illustrated, $V_O$-PD 702 can be a power detection signal received from a power detector, such as the $V_O$-PD 609 power detection signal in FIG. 6; Programming signal 700 can be an 8 bit digital input signal from a SPI (serial parallel interface) or I2C protocol; DAC 701 can be a digital to analog converter; Amp 703 can be an amplifier; LPF 704 can be a low-pass filter; $V_c$ 706 can be a produced analog control voltage signal; and Control Signal Generator 705 can be a unit that processes the analog control voltage signal $V_c$ 706 to produce 12 control voltage signals VG0 to VG11 707. The components may be electronically connected as illustrated. The 12 control voltage signals VG0 to VG11 707 can be conveyed to other components to control the respective components. For example, the control voltage signals VG0 to VG11 707 can be conveyed to corresponding active resistors in an attenuator as shown in FIG. 4, which attenuator can be contained in a buffer 205, 207 as illustrated in FIG. 2, to set the level of attenuation in the corresponding buffers. An example of the Control Signal Generator 705 will be described in further detail in FIG. 8.

The analog control voltage signal $V_c$ 706 can change in a linear relationship with the power detection signal $V_O$-PD 702. The power detection signal $V_O$-PD 702 can be compared to the reference voltage conveyed from the DAC 701 in the amplifier 703; filtering in the low pass filter 704 can generate the analog control voltage signal $V_c$ 706. The reference voltage can be precisely generated by the 8 bit DAC 701. The DAC 701 can be controlled by an SPI or I2C protocol. Hence, the digital programming signal 700 coming from the SPI or I2C protocol can program the DAC 701 to set the power of a signal that is produced in a feedback loop containing the illustrated radio frequency RSSI. For example, if the RSSI is implemented in a configuration as illustrated in FIG. 2, because the power detector 218 measures signal power after the LNAs 208, 206, the RF-RSSI 215 can be programmed to fix the output power of the LNAs 208, 206 at a defined value by programming the DAC 701 through the SPI or I2C protocol.

In another embodiment, the RSSI can be non-programmable. In that case, instead of the reference voltage from the DAC 701, a fixed voltage can be conveyed to the positive input of the amplifier 703 to be compared in the amplifier 703 with the power detection signal $V_O$-PD 702.

As described above, the attenuation in buffers, such as the buffers 205, 208 in FIG. 2, can be implemented through 12 active resistors incorporated in the respective buffer. An example of such a buffer with active resistors is illustrated in FIG. 4. An RSSI, such as one as described in FIG. 7, can produce control voltage signals VG0 to VG11 707 to control the respective active resistors and thereby set the level of attenuation in a buffer. A Control Signal Generator 705 in an RSSI can process the analog control voltage signal $V_c$ 706 to produce 12 control voltage signals VG0 to VG11 707.

Figure 8:
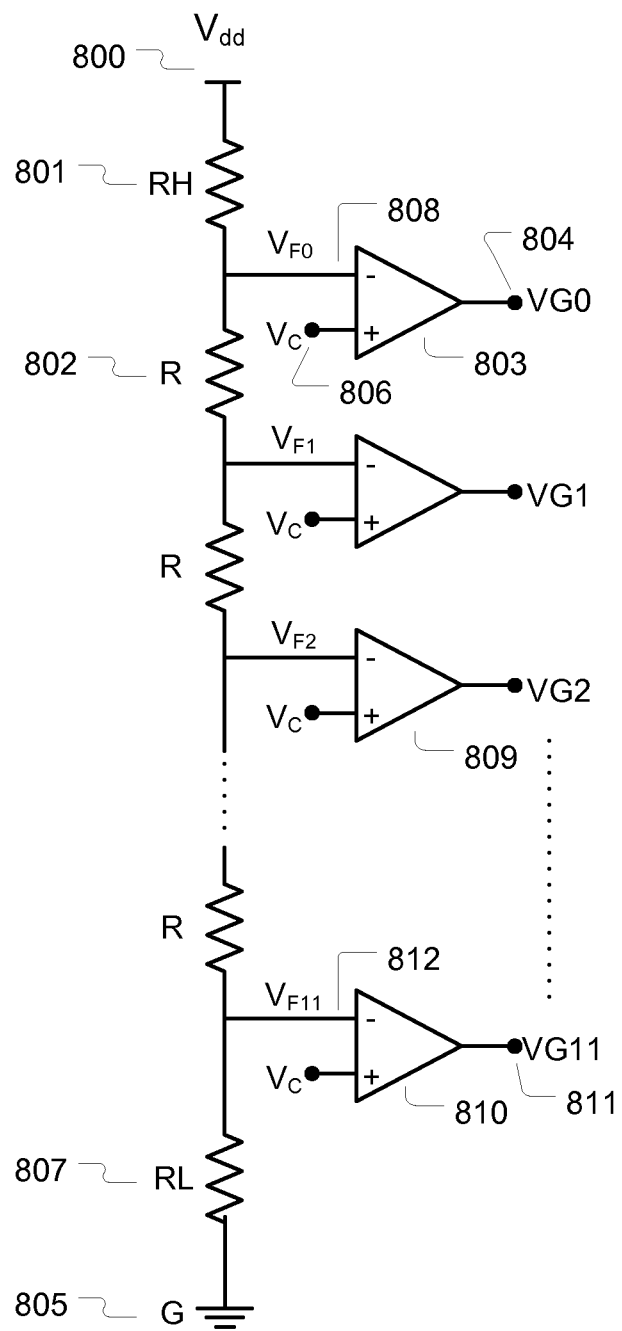
FIG. 8 shows an example of a control signal generator in accordance with various embodiments.

FIG. 8 shows an example of a control signal generator in accordance with various embodiments. The described control signal generator can be an example of the Control Signal Generator 705 in the RSSI illustrated in FIG. 7. The control signal generator can receive an analog control voltage signal $V_c$ 806 and produce 12 control voltage signals VG0 804 to VG11 811 that can be conveyed to 12 corresponding active resistors in another component, such as the active resistors of the attenuator in the buffer 205, 207 in FIG. 2, to control a function of that component, such as the amount of attenuation produced in the buffer. In the example illustrated, $V_{dd}$ 800 is a positive power supply; RH 801 is a resistor; R 802 is a resistor; $V_{FO}$ 808 is a fixed voltage; $V_c$ 806 is an analog control voltage signal received at the control signal generator; $V_c$ 806 and $V_{FO}$ 808 can be conveyed to a low speed comparator 803; VG0 804 is a produced control voltage signal; RL 807 is a resistor; and G 805 is a ground connection. The components may be electronically connected as illustrated.

For the sake of simplicity, only four comparators and corresponding components are illustrated in FIG. 8. The remaining eight comparators and the corresponding resistors, input analog control voltages ($V_c$), fixed voltages, and produced control signals are omitted because their illustration is identical. Namely, after the third comparator 809, another resistor can be connected in series with the path, the resistor can be followed by a fourth comparator, which can produce a control voltage signal VG3, another resistor can follow the fourth comparator, and so on until the twelfth comparator 810, which can generate the control voltage signal VG11 811. The twelfth comparator can be followed by the resistor RL 807, which resistor can be followed by the ground connection G 805. Each comparator producing control voltage signals VG0 804 through VG11 811 can receive an identical analog control voltage signal $V_c$ 806 and a different corresponding fixed voltage signal $V_{F0}$ 808 through $V_{F11}$ 812, respectively. Hence, to generate the twelve control voltage signals VG0 804 to VG11 811 in the control signal generator, the input analog control voltage $V_c$ is compared to 12 fixed voltages $V_{F0}$ 808 through $V_{F11}$ 812 in 12 low speed comparators.

Stability of feedback loops can be optimized by providing a dominant pole in the feedback loop; for example, the low pass filter 704 of FIG. 7 can produce the dominant pole of the corresponding feedback loop. By adjusting the low pass filter 704, the loop can work with highly fluctuating signals, such as signals with fluctuations caused by fading or Doppler effects, as can occur in mobile applications.

In various embodiments, incoming RF signals across a wide range of powers can be amplified to produce continuous signals of a fixed, desired power while maintaining other desirable signal characteristics such as noise and linearity. Namely, by using a main path configured for optimal amplification of low power incoming RF signals and a bypass path configured for optimal amplification of high power incoming RF signals, as described in above embodiments, with continuous feedback loops to further adjust amplification when the signal is routed to either path signals of both extremely weak power and extremely strong power can be amplified to produce a signal with continuously stable and desirable power in addition to other favorable signal characteristics such as noise and linearity.

In various embodiments, undesirable low and/or high frequencies can be filtered from a received RF signal or a previously amplified received RF signal, the filtering can be performed in a band-pass filter, for example. The signal can be converted from voltage to current in a transconductor, which transconductor may be able to produce adjustable gain. The signal can be amplified with variable levels of amplification. The signal can be amplified during, before, and/or after the voltage to current conversion with variable amounts of amplification. The signal can be down converted to a low frequency, such as an intermediate or a baseband frequency. An in-phase signal component and a quadrature-phase signal component of the signal can be produced. Undesirable frequencies can be filtered from the down-converted signal. The power of the produced signal can be measured and adjusted by varying the amount of amplification in the amplifying components, which adjustment can be based on the measured signal power, according to a defined logic incorporated into the device. Both the adjustment of amplification and the signal power measurement can be continuous.

In various embodiments, a RF signal can be conveyed to a RF band-pass filter. Any systems that control the amount of amplification of the RF signal can be configured so that the RF signal is amplified to reach a predefined preferred power prior to being conveyed to the band-pass filter. After being filtered in the band-pass filter, the RF signal can be conveyed to a transconductor with adjustable gain, where the signal can be converted from voltage to current. After the signal is converted to current in the transconductor and amplified, the signal can be conveyed to a mixer or quadrature switches, where the signal can be transferred to a lower frequency such as baseband or intermediate frequency (IF), and/or where I and Q signal components of the signal can be produced. The produced signal or produced I and Q signal components can be passed through a low-pass filter. The power of the produced signal or produced I and Q signal components can be adjusted through a continuous feedback loop wherein the power of the signal or one or both of the I and Q signal components can be measured and the gain in the transconductor can be adjusted based on the measured signal power according to defined logic incorporated in the device.

As described above, a signal can be conveyed to a set of components where the signal can be down converted to low frequencies and undesired frequencies can be removed from the signal by filtering. The incoming signal can be a signal that has been received at the RF receiver and amplified, which amplification can take place in a configuration of components as illustrated in FIG. 2. A continuous feedback loop can be used to fix the power of the produced low frequency signal.

Figure 9:
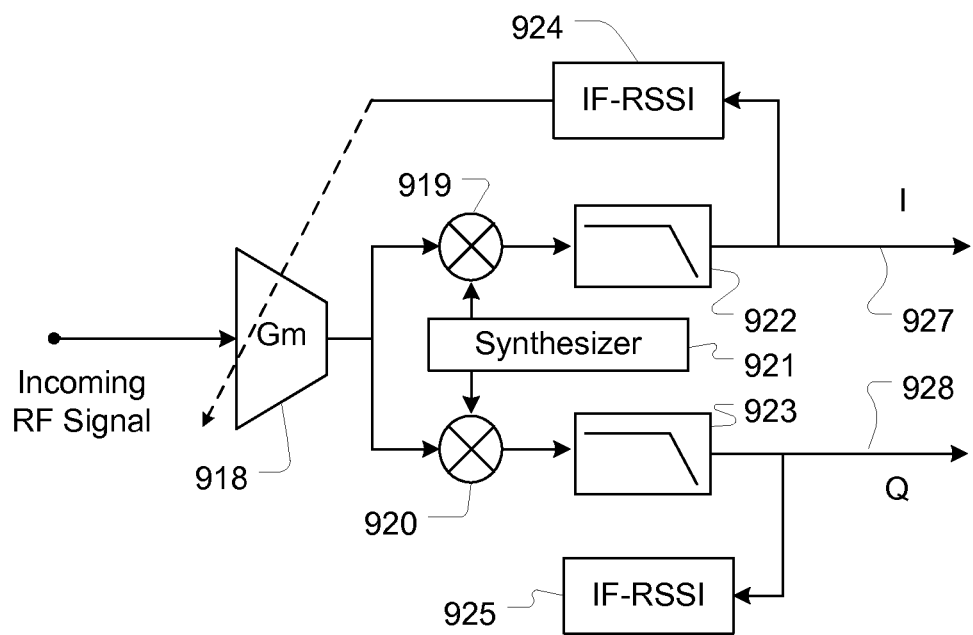
FIG. 9 shows an example of a configuration of components for down converting a RF signal and fixing the power of a produced low frequency signal, in accordance with various embodiments of the invention.

FIG. 9 shows an example of a configuration of components for down converting a RF signal and fixing the power of a produced low frequency signal, in accordance with various embodiments of the invention. The incoming RF signal can be a signal that has been received at the RF receiver, amplified in an amplifier stage, and filtered in a band-pass filter, all of which can take place in a configuration of components as illustrated in FIG. 2. The signal can be conveyed to a transconductor (Gm) 918, which can convert the signal from voltage to current and amplify the signal with adjustable amounts of gain. In an embodiment, the amplification in the transconductor 918 can be varied, for example, the gain can vary by 30 dB. After the transconductor 918, the signal can be conveyed down an in-phase (I) path and a quadrature-phase (Q) path. The signal can be down converted to intermediate frequencies (IF) in a quadrature switch 919 on the I path and a quadrature switch 920 on the Q path. The quadrature switches can be driven by a synthesizer 921. The signal on the I path can be conveyed to a low-pass filter 922, which can be a first order RC active filter, and the signal on the Q path can be conveyed to another low-pass filter 923, which can also be a first order RC active filter. In various embodiments, the total amplification of the signal in the transconductor 918 and the active low pass filter 922, 923 together can be 24 dB.

In various embodiments, a continuous feedback loop can be used to fix the power of a signal produced on the I path 927 and a signal produced on the Q path 928. For example, the signal produced on the I path 927 can be conveyed to a IF RSSI 924. The signal power can be measured and the signal's power can be adjusted by changing the amount of amplification in the transconductor 918 based on the measured signal power according to executable logic incorporated in the IF RSSI 924. In various embodiments, the signal power can be measured by a power detector located in the IF RSSI 924 or in a power detector located before the IF RSSI 924. The adjustment of amplification can be performed continuously. It should be noted that the power of the signal produced on the I path and the Q path can be identical and that by changing the amplification produced in the transconductor 918, the power of the signal produced on both the I path and the Q path can changed identically; hence, to fix the power of both the produced I signal 927 and produced Q signal 928, it can be enough to measure the signal power on one of the I and Q paths and adjust the amplification produced in the transconductor 918 respectively. Thus, the corresponding components and functions described here as being performed on the I path can similarly be performed on the Q path and vice versa. In one embodiment, the signal power can be measured using continuous IF power measurement. The signal can be measured in the IF RSSI 924 or the signal can be measured in another component and the measured signal power value can be conveyed to the IF RSSI 924. Hence, in various embodiments, the IF RSSI 924 can be configured so that the power of the signal produced on the I path 927 and the power of the signal produced on the Q path 928 is a fixed preferred value. For example, the continuous feedback loop can be configured so that the determined preferred value of the signal on the I path 927 is −10 dBm. In that case, if the IF RSSI 924 measures that the power of the produced signal is −5 dBm, the IF RSSI 924 can send a signal to the adjustable transconductor 918 to decrease amplification in the adjustable transconductor 918 by 5 dB. Similarly, if the IF RSSI 924 measures that the produced signal's power is −15 dBm, the IF RSSI 924 can send a signal to the adjustable transconductor 918 to increase amplification in the adjustable transconductor 918 by 5 dB. In various embodiments, the IF RSSI 924 can be configured so that the determined preferred value of the signal power produced on the I path 927 in the continuous feedback loop can be changed. For example, either through user input or through a decision made by logic incorporated in the device, the determined preferred value of the signal power after amplification on the I path in the device of the above example may be changed to −15 dBm instead of −10 dBm. In various embodiments, the determined preferred value of the signal power can be programmable through serial ports in the IF RSSI 924 through a SPI or I2C protocol. In various embodiments, to avoid creating an imbalance in signal characteristics between the signals on the I path and the Q path, the signal on the Q path can be conveyed to a IF RSSI 925 so that the load on the Q path is matched to the load on the I path.

Generally, the signal received at the transconductor 918 can contain undesirable components, such as blockers, adjacent channels, and noise, which undesirable components may be of significantly higher power than the desired component of the signal and hence are preferably removed before the signal power is measured for adjusting the level of amplification in the transconductor. In various embodiments, after voltage to current conversion and amplification in the transconductor 918, the signal can be conveyed to quadrature switches 919, 920 and to low pass filters 922, 923 to remove undesirable signal components and produce a desired signal. The IF RSSI 924 can measure the power of the desired signal and fix it at a preferred power value by adjusting the gain in the transconductor 918 based on the measured power of the desired signal, according to executable logic incorporated in the IF RSSI 924. Thus, the method and system can produce a desired signal component of a fixed, preferred power while eliminating undesirable components.

Figure 10:
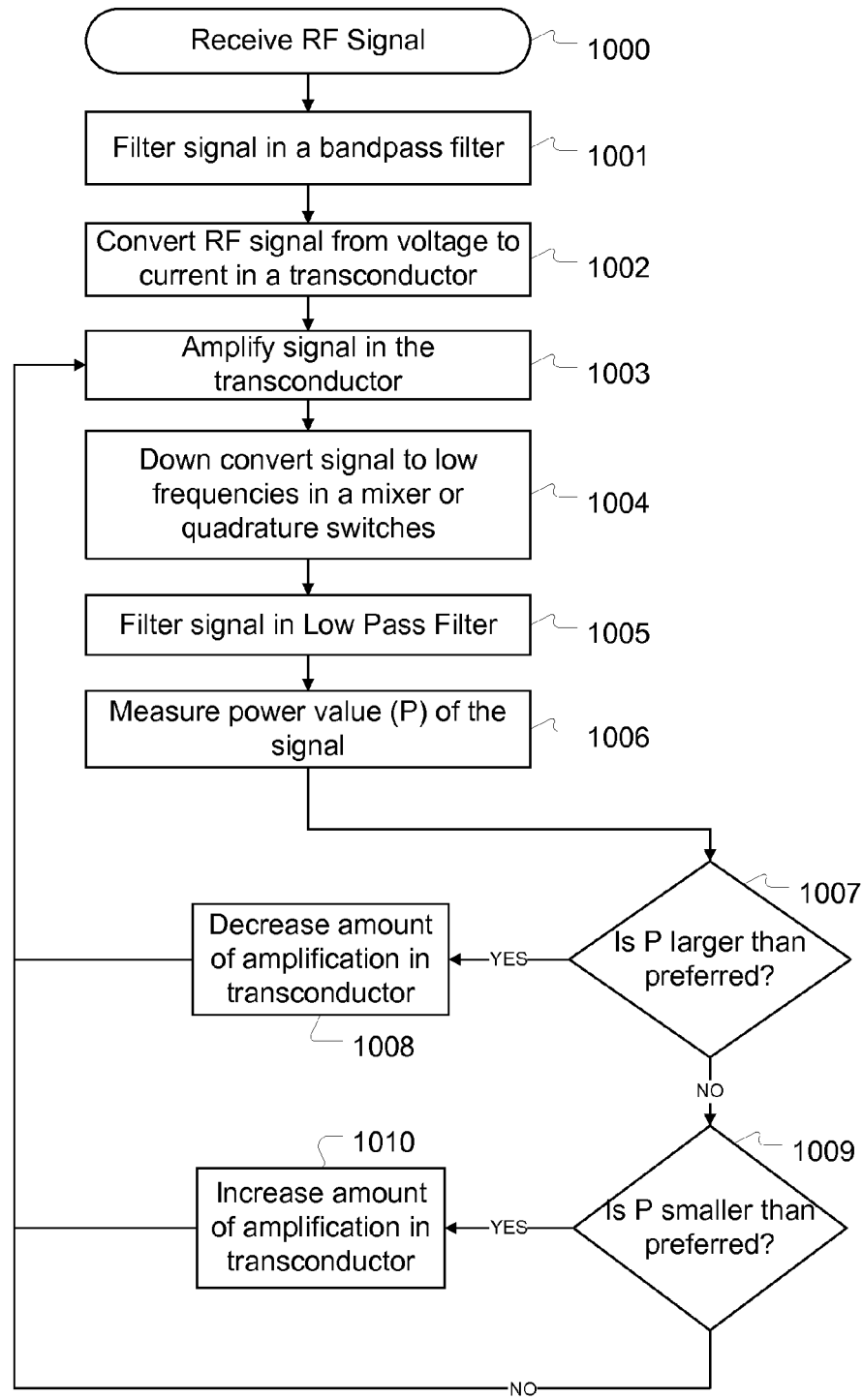
FIG. 10 is a flow-chart illustration of the process of down converting a RF signal and fixing the power of a produced low frequency signal, in accordance with various embodiments of the invention.

FIG. 10 is a flow-chart illustration of the process of down converting a RF signal and fixing the power of a produced low frequency signal, in accordance with various embodiments of the invention. As illustrated in FIG. 4, a RF signal can be received 1000 and the signal can be filtered in a bandpass filter 1001. The RF signal can be converted from voltage to current in a transconductor 1002. The signal's power can be amplified in the transconductor 1003 with a variable level of amplification. The signal can be down converted to low frequencies, such as intermediate or baseband frequencies, in a mixer or quadrature switches 1004. Undesired frequencies can be filtered from the signal in a low pass filter 1005. The power of the signal can be measured to derive a power value (P) 1006. If the power value (P) is larger than a preferred value, then a decision 1007 can be made to decrease the amount of amplification in the transconductor 1008 and amplification of subsequent signals in the transconductor 1003 can be performed with the decreased levels of amplification. Otherwise, if P is smaller than preferred, then a decision 1009 can be made to increase the amount of amplification in the transconductor 1010 and amplification of subsequent signals in the transconductor 1003 can be performed with the increased levels of amplification. Otherwise, amplification of subsequent signals in the transconductor 1003 can be performed with unchanged levels of amplification.

Figure 11:
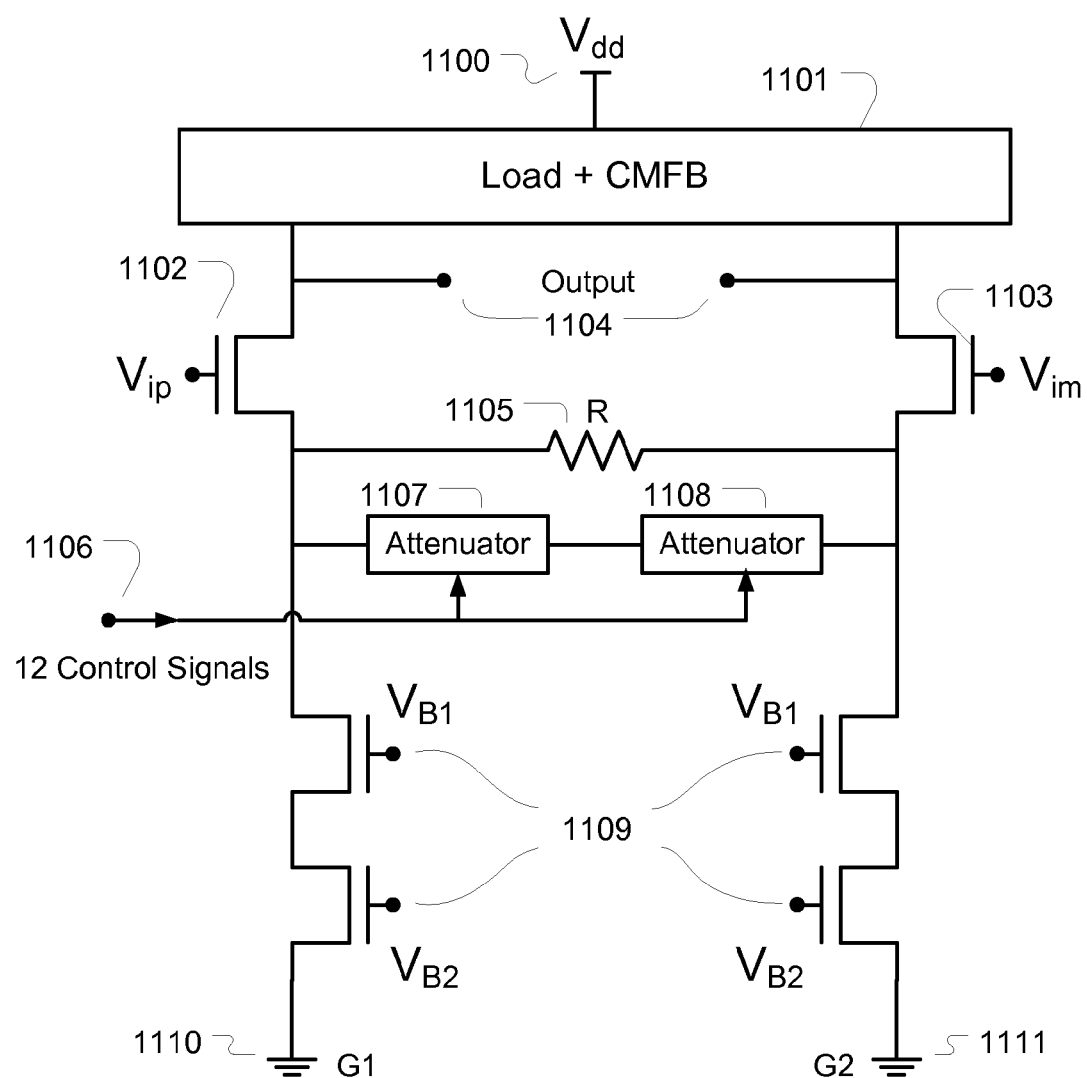
FIG. 11 shows an example of a transconductor comprising a substantially linear attenuator in accordance with various embodiments.

FIG. 11 shows an example of a transconductor comprising a substantially linear attenuator in accordance with various embodiments. In the example illustrated, $V_{dd}$ 1100 can be a positive power supply; Load+CMFB 1101 can be a common mode feedback and load; $V_{ip}$ can be a positive input; $V_{im}$ 1103 can be a negative input; Output 1104 can be a differential output; R 1105 can be a resistor; Attenuators 1107 and 1108 can be substantially linear attenuators; 12 Control signals 1106 can be control voltage signals conveyed to the attenuators to control attenuation in the transconductor, for example, the 12 control signals can come from an RSSI such as the IF RSSI 317 in FIG. 3; $V_{B1}$ and $V_{B2}$ 1109 can be a fixed voltage bias; G1 1110 can be a ground; and G2 1111 can be a ground. The components may be electronically connected as illustrated. In various embodiments, the transconductor can produce 30 dB of programmable attenuation range.

Because the input signal at the transconductor can be high power and can contain powerful blockers, it can be desirable to implement a highly linear transconductor to meet the required SNDR. Moreover, it can be desirable for the gain in the transconductor to be programmable. Linearity and programmability can be achieved by implementing a highly linear, programmable attenuator in the transconductor. For example, in the transconductor illustrated in the example of FIG. 11, the attenuators 1107 and 1108 can comprise highly linear, programmable attenuators. In various embodiments, the transconductor can contain a single attenuator or several attenuators in series, such as two attenuators in series as illustrated in FIG. 11. Placing several attenuators in series can improve characteristics such as linearity and symmetry performance. In an embodiment, the architecture of the attenuator(s) can be similar to the architecture of the attenuator described in FIG. 4. The level of attenuation in the attenuator and the level of gain in the transconductor can be controlled by an RSSI, such as the IF RSSI 924 in FIG. 9. For example, the RSSI can send control voltage signals to the active resistors contained in the attenuators in the transconductor(s). The architecture of the RSSI can be similar to the architecture of the RSSI described in FIG. 7.

In various embodiments, a first portion of the RF tuner can comprise a configuration of LNAs, continuous feedback loops, and bypass paths, as described by example in FIG. 2, for receiving incoming RF signals in a wide range of powers and producing RF signals of a fixed preferred power with desirable signal characteristics. A second portion of the RF tuner can comprise a configuration of components for down converting the signal to a low frequency, filtering undesired components out of the signal, and amplifying the signal in a continuous feedback loop to produce a low frequency signal with a fixed preferred power and other desirable characteristics, as described by example in FIG. 9.

Figure 12:
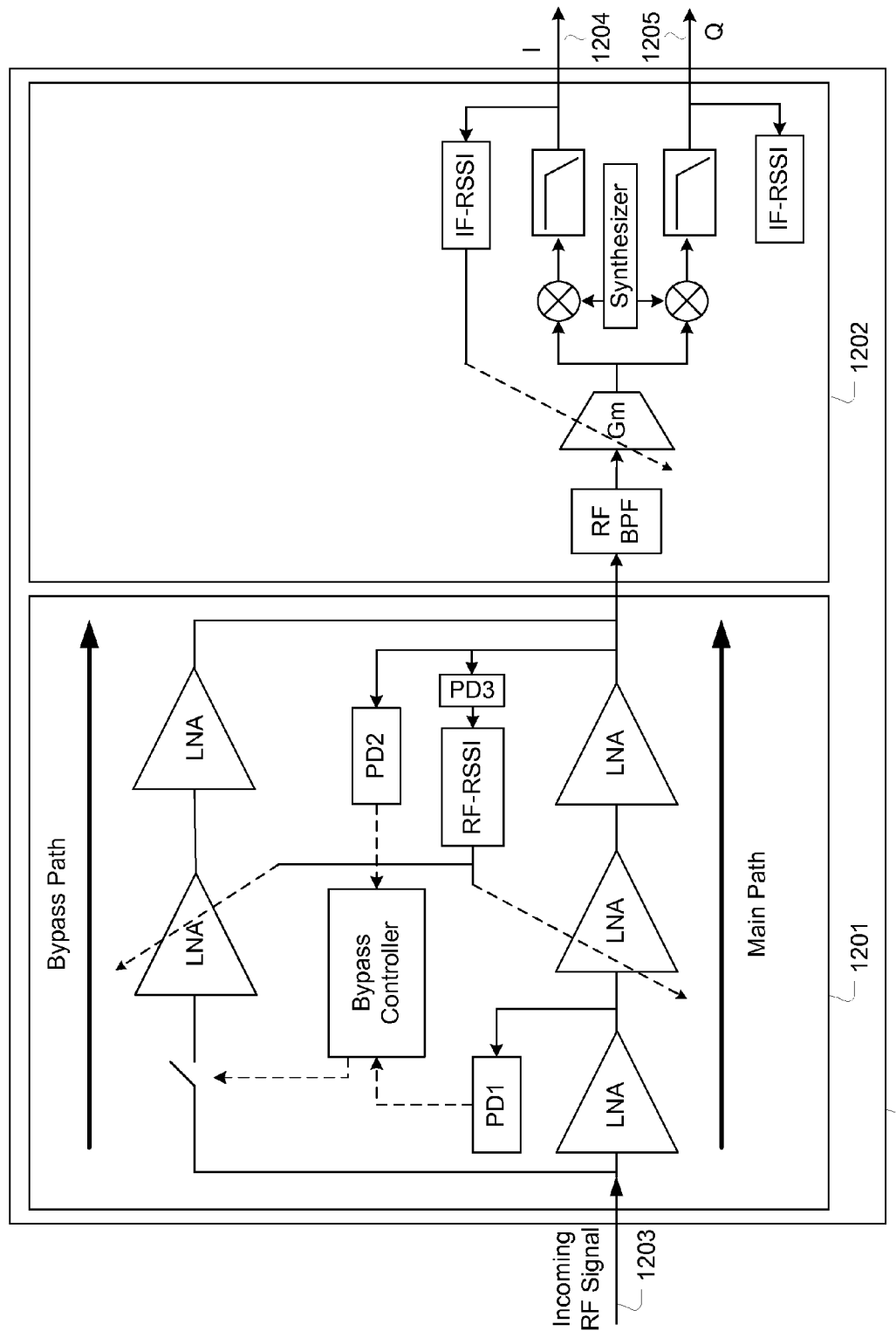
FIG. 12 shows an example of a RF tuner with a portion where RF signals in a broad range of powers can be amplified to produce RF signals of a fixed preferred power and a portion where RF signals can be down converted, filtered to remove undesired components, and amplified to produce a low frequency signal with a fixed preferred power, in accordance with one embodiment.

FIG. 12 shows an example of a RF tuner with a portion where RF signals in a broad range of powers can be amplified to produce RF signals of a fixed preferred power and a portion where RF signals can be down converted, filtered to remove undesired components, and amplified to produce a low frequency signal with a fixed preferred power, in accordance with one embodiment. As illustrated in FIG. 12, incoming RF signals 1203 can be received in the RF tuner 1200. The RF signals 1203 can be in a broad range of powers. The RF signals 1203 can be conveyed to a first set of components 1201, which first set of components can comprise continuous feedback loops and bypass paths that perform amplification of the RF signals to produce RF signals of a fixed power with other desirable characteristics. The signal can then be conveyed to a second set of components 1202, where the signal can be down converted, filtered to remove undesired components, and amplified to produce an in-phase 1204 low frequency signal component of a fixed preferred power and a quadrature-phase 1205 low frequency signal component of a fixed preferred power.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Hence, alternative arrangements and/or quantities of amplifiers, bypass switches, RSSIs, power detectors, transmission paths, and other components can occur without departing from the spirit and scope of the invention. Similarly, components not explicitly mentioned in this specification can be included in various embodiments of this invention without departing from the spirit and scope of the invention. Also, functions and logic described as being performed in certain components in various embodiments of this invention can, as would be apparent to one skilled in the art, be readily performed in whole or in part in different components or in different configurations of components not explicitly mentioned in this specification, without departing from the spirit and scope of the invention. Accordingly, the specification and drawings are to be regarded in an illustrative rather than a restrictive sense.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Accordingly, the specification and drawings are to be regarded in an illustrative rather than a restrictive sense.

Reference in the specification to "an embodiment," "one embodiment," "some embodiments," "various embodiments" or "other embodiments" means that a particular feature, structure, or characteristic described in connection with the embodiments is included in at least some embodiments, but not necessarily all embodiments. References to "an embodiment," "one embodiment," or "some embodiments" are not necessarily all referring to the same embodiments. If the specification states a component, feature, structure, or characteristic "may," "can," "might," or "could" be included, that particular component, feature, structure, or characteristic is not required to be included. If the specification or Claims refer to "a" or "an" element, that does not mean there is only one of the element. If the specification or Claims refer to an "additional" element, that does not preclude there being more than one of the additional element.

The invention claimed is:

1. A method for processing a radio frequency (RF) signal in a RF receiver, the method comprising:
    receiving the RF signal at the RF receiver;
    amplifying the RF signal on a main path in a component with an adjustable level of amplification;
    measuring at a first power detector a first power value of the RF signal after amplification by the component;
    detecting that the first power value of the RF signal is larger than a first threshold;
    conveying the RF signal to a bypass path that produces less amplification than the main path in response to detecting that the first power value of the RF signal is larger than the first threshold;
    measuring at a second power detector a second power value of the RF signal after amplification by the bypass path;
    detecting that the second power value of the RF signal is smaller than a second threshold;
    conveying the RF signal to the main path in response to detecting that the second power value is smaller than the second threshold;
    measuring at a third power detector a third power value of the RF signal after amplification by the main path or the bypass path;
    detecting whether the third power value is larger or smaller than a preferred power value for the main path or the bypass path; and
    decreasing or increasing the amount of amplification on the main path or bypass path in response to detecting that the third power value is larger or smaller than the preferred power value.

2. The method of claim 1, further comprising:
    detecting that the first power value is larger than a preferred power value;
    continuously decreasing the level of amplification in the component on the main path if the first power value is larger than the preferred power value.

3. The method of claim 1, wherein conveying the RF signal to the bypass path further comprises:
    closing one or more switches on the bypass path while opening the one or more switches on the main path, or closing one or more active resistors on the bypass path while opening active resistors on the main path.

4. The method of claim 3, further comprising:
    adjusting the level of amplification on the bypass path by modulating the one or more active resistors or the one or more switches on the bypass path, based at least in part on a measured signal power.

5. The method of claim 3, further comprising:
    controlling the one or more active resistors or the one or more switches by conveying a control signal to each active resistor or switch, wherein the control signal is produced for each active resistor or switch in a respective comparator by comparing a measured power of the signal with a fixed reference signal in the comparator, wherein a different fixed reference signal is compared to the measured power of the signal in each comparator.

6. An apparatus for processing a radio frequency (RF) signal in a RF receiver, comprising:
    an amplifying component that amplifies the RF signal with an adjustable level of amplification on a main path;
    a first power detector for measuring a first power value of the RF signal after amplification by the amplifying component;
    a switch operable to convey the RF signal to a bypass path that produces less amplification than the main path in response to detecting that the first power value of the RF signal is larger than the first threshold;
    a second power detector for measuring a second power value of the RF signal after amplification by the bypass path;
    wherein the switch is operable to convey the RF signal to the main path in response to detecting that the second power value is smaller than a second threshold; and a third power detector for measuring a third power value of the RF signal after amplification by the main path or the bypass path;

wherein the third power value determines whether to decrease or increase the adjustable level of amplification of the RF signal on the main path or the bypass path.

7. The apparatus of claim 6, wherein the amplifying component further comprises at least one of: a buffer, a low noise amplifier, and a transconductor.

8. The apparatus of claim 6, wherein the amplifying component continuously decreases the level of amplification in the component on the main path if the first power value is larger than a preferred power value.

9. The apparatus of claim 6, wherein the amplifying component further contains at least one of: an amplifier or a series of amplifiers; and amplification is adjusted at least by adjusting the level of amplification in the amplifier or the series of amplifiers, based on the measured power of the signal.

10. The apparatus of claim 9, wherein the one of the amplifier or the series of amplifiers is connected to a source node of an input transistor of the amplifying component.

11. The method of claim 1, further comprising:

detecting whether the first power value is larger or smaller than a preferred power value for the main path; and decreasing the amount of amplification on the main path in response to detecting that the first power value is larger than the preferred power value; or increasing the amount of amplification on the main path in response to detecting that the first power value is smaller than the preferred power value.

12. The method of claim 11, further comprising:

detecting whether the second power value is larger or smaller than a second preferred power value for the bypass path; and decreasing the amount of amplification on the bypass path in response to detecting that the second power value is larger than the second preferred power value; or increasing the amount of amplification on the bypass path in response to detecting that the second power value is smaller than the second preferred power value.

13. The method of claim 1, wherein the first threshold and the second threshold are configured to create a power hysteresis.

14. The apparatus of claim 6, wherein in response to detecting that the first power value is larger than a preferred power value, the amplifying component decreases the amount of amplification on the main path; or in response to detecting that the first power value is smaller than the preferred power value, the amplifying component increases the amount of amplification on the main path.

15. The apparatus of claim 14, further comprising: a second amplifying component that amplifies the RF signal with an adjustable level of amplification on the bypass path;

wherein in response to detecting that the second power value is larger than a second preferred power value, the second amplifying component decreases the amount of amplification on the bypass path; or in response to detecting that the second power value is smaller than the second preferred power value, the second amplifying component increases the amount of amplification on the bypass path.

16. The apparatus of claim 6, wherein the first threshold and the second threshold are configured to create a power hysteresis.

* * * * *